(12) United States Patent
Ukita

(10) Patent No.: US 9,451,699 B2
(45) Date of Patent: Sep. 20, 2016

(54) CIRCUIT BOARD, ELECTRONIC DEVICE, AND METHOD OF MANUFACTURING CIRCUIT BOARD

(71) Applicant: KABUSHIKI KAISHA TOSHIBA, Minato-ku, Tokyo (JP)

(72) Inventor: Yasunari Ukita, Kamakura (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 480 days.

(21) Appl. No.: 14/017,567

(22) Filed: Sep. 4, 2013

(65) Prior Publication Data

US 2014/0029216 A1 Jan. 30, 2014

Related U.S. Application Data

(63) Continuation of application No. PCT/JP2013/057940, filed on Mar. 13, 2013.

(30) Foreign Application Priority Data

Jul. 24, 2012 (JP) ................................ 2012-164101

(51) Int. Cl.
  *H05K 1/18* (2006.01)
  *H05K 3/34* (2006.01)
  *H05K 1/02* (2006.01)

(52) U.S. Cl.
  CPC ............ *H05K 1/181* (2013.01); *H05K 1/0271* (2013.01); *H05K 1/18* (2013.01); *H05K 1/184* (2013.01);
  (Continued)

(58) Field of Classification Search
  CPC ........ H05K 1/18; H05K 1/181; H05K 1/184; H05K 3/3436

USPC ................................................... 361/748, 752
  See application file for complete search history.

(56) References Cited

U.S. PATENT DOCUMENTS

6,882,042 B2* 4/2005 Zhao ....................... H01L 23/16
  257/706
2006/0169488 A1* 8/2006 Kaji ..................... H05K 1/0271
  174/260

(Continued)

FOREIGN PATENT DOCUMENTS

JP  10-056110    2/1998
JP  2005-302924  10/2005

(Continued)

OTHER PUBLICATIONS

International Search Report and Written Opinion for International Application No. PCT/JP2013/057940, mailed on Jun. 11, 2013 in 11 pages.

(Continued)

*Primary Examiner* — David Warren
(74) *Attorney, Agent, or Firm* — Knobbe, Martens, Olson & Bear LLP

(57) ABSTRACT

According to one embodiment, a circuit board is provided with a first rectangular electronic component, a board and a reinforcing plate. The first electronic component has a plurality of connection terminals. The board has the first electronic component mounted thereon via the connection terminals, and has a through hole for receiving a second electronic component at a position at which the first electronic component overlaps with the second electronic component. The reinforcing plate is attached to the back surface of the board, and has a plurality of first portions near the corner portions of the first electronic component, and a second portion of a strip shape coupling the first portions and located near the hole. The first and second portions are formed integral as one body.

3 Claims, 13 Drawing Sheets

(52) U.S. Cl.
CPC ... *H05K 3/3436* (2013.01); *H05K 2201/09054* (2013.01); *H05K 2201/09072* (2013.01); *H05K 2201/2009* (2013.01); *Y02P 70/611* (2015.11); *Y02P 70/613* (2015.11)

(56) References Cited

U.S. PATENT DOCUMENTS

| | | | |
|---|---|---|---|
| 2007/0063324 A1 | 3/2007 | Mishiro et al. | |
| 2007/0108996 A1* | 5/2007 | Amemiya | G01R 1/07371 324/750.25 |
| 2007/0145988 A1* | 6/2007 | Garabedian | G01R 1/07378 324/750.22 |
| 2009/0323295 A1* | 12/2009 | Houle | H01L 23/16 361/748 |
| 2010/0020505 A1* | 1/2010 | Brodsky | H05K 1/144 361/721 |
| 2010/0071940 A1* | 3/2010 | Ejiri | C23C 18/1651 174/257 |
| 2010/0194420 A1* | 8/2010 | Kitazume | G01R 1/06727 324/756.03 |
| 2011/0253428 A1* | 10/2011 | Lim | H01L 23/16 174/255 |
| 2013/0021769 A1* | 1/2013 | Fukuzono | H01L 23/13 361/783 |
| 2013/0069686 A1* | 3/2013 | Wu | G01R 3/00 324/756.03 |
| 2013/0333930 A1* | 12/2013 | Koyanagi | H05K 1/184 174/258 |
| 2014/0029216 A1* | 1/2014 | Ukita | H05K 1/181 361/752 |
| 2014/0054080 A1* | 2/2014 | Sato | H05K 1/183 174/266 |
| 2014/0055967 A1* | 2/2014 | Sato | H05K 1/184 361/761 |
| 2014/0237815 A1* | 8/2014 | Lau | H01L 21/68 29/834 |
| 2014/0340108 A1* | 11/2014 | Lou | G01R 1/07357 324/756.03 |
| 2015/0241729 A1* | 8/2015 | Kim | G02F 1/13452 349/12 |
| 2015/0334859 A1* | 11/2015 | Lee | H05K 5/0247 361/749 |
| 2015/0366061 A1* | 12/2015 | Noda | H05K 1/141 361/803 |

FOREIGN PATENT DOCUMENTS

| | | |
|---|---|---|
| JP | 2006-210852 | 8/2006 |
| JP | 2007-088293 | 4/2007 |
| JP | 2011-198810 | 10/2011 |
| JP | 2011-258836 | 12/2011 |
| WO | WO 2011/121779 | 10/2011 |

OTHER PUBLICATIONS

Office Action received in Japanese Application No. 2012-164101 dated Feb. 16, 2016.

* cited by examiner

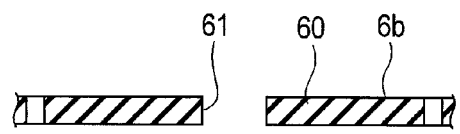
F I G. 9A
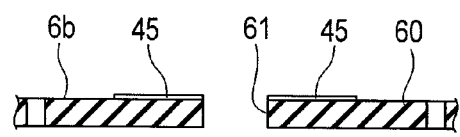
F I G. 9B
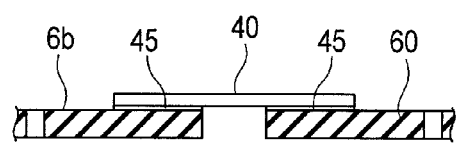
F I G. 9C
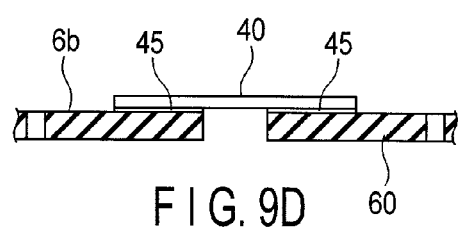
F I G. 9D
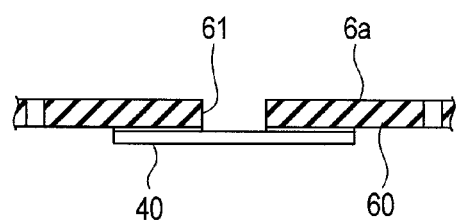
F I G. 9E
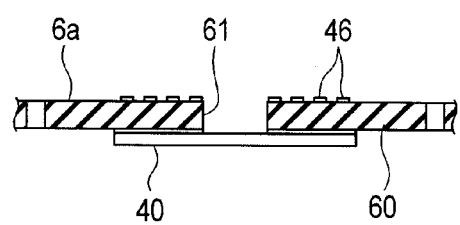
F I G. 9F
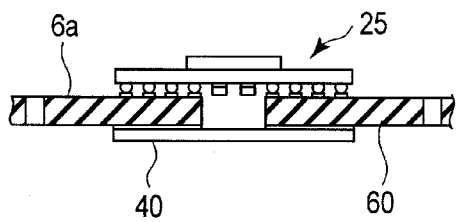
F I G. 9G
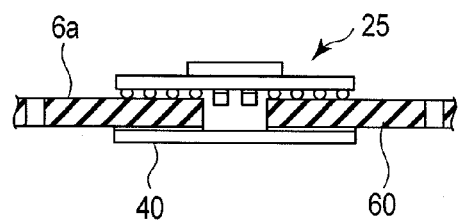
F I G. 9H

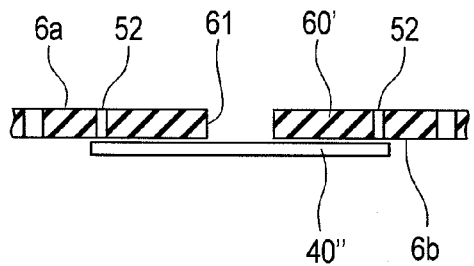
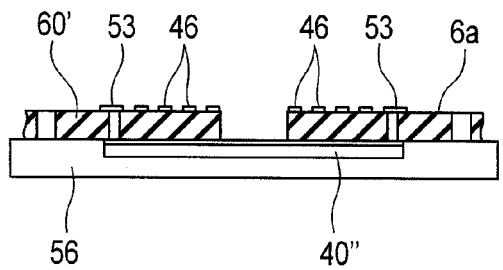
F I G. 12A        F I G. 12B
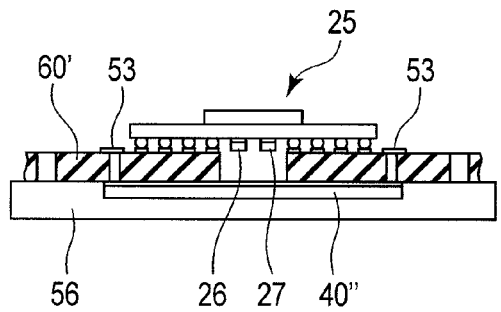
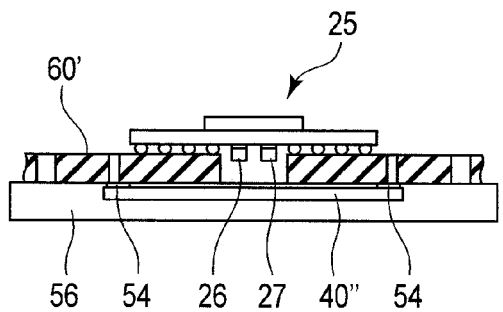
F I G. 12C        F I G. 12D
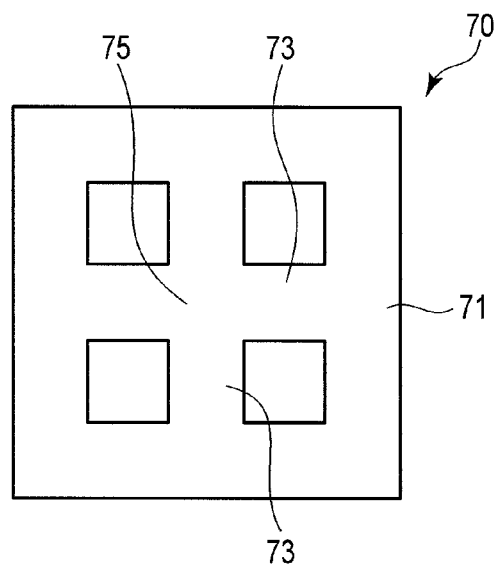
F I G. 13

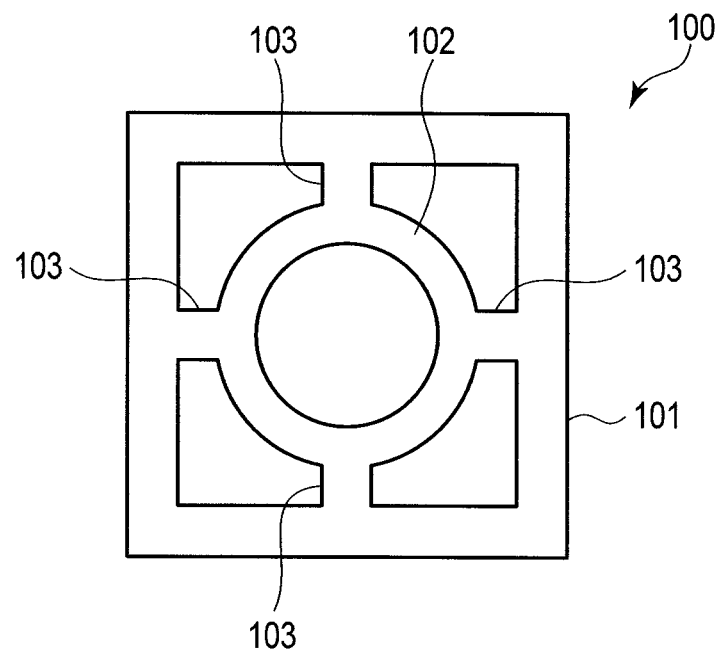
F I G. 16
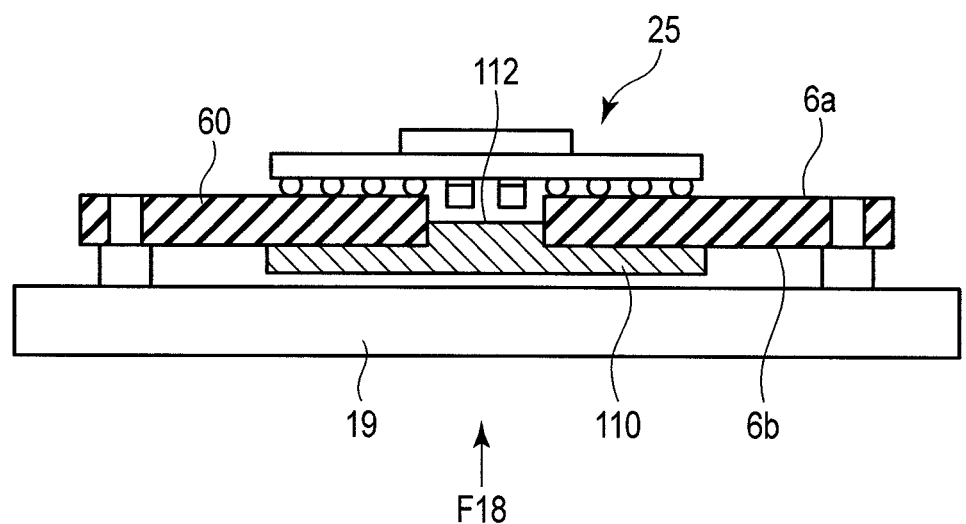
F I G. 17

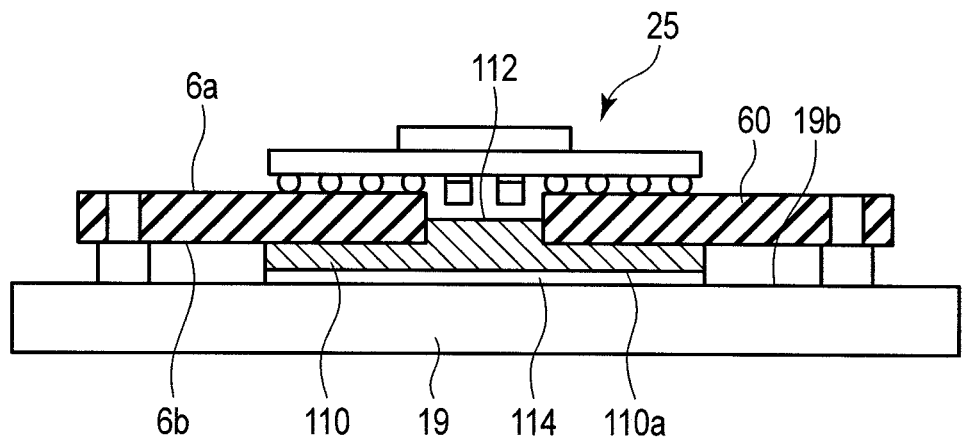
F I G. 21
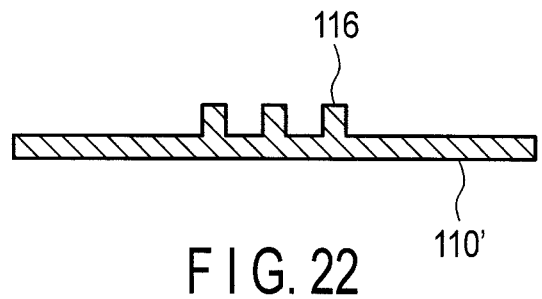
F I G. 22
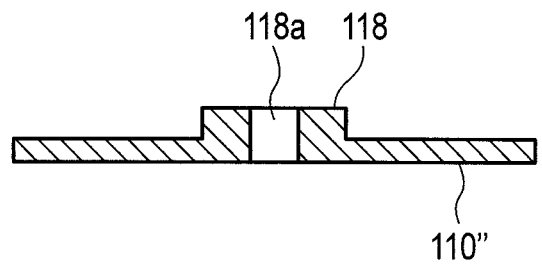
F I G. 23

CIRCUIT BOARD, ELECTRONIC DEVICE, AND METHOD OF MANUFACTURING CIRCUIT BOARD

CROSS REFERENCE TO RELATED APPLICATIONS

This application is a Continuation Application of PCT Application No. PCT/JP2013/057940, filed Mar. 13, 2013 and based upon and claiming the benefit of priority from Japanese Patent Application No. 2012-164101, filed Jul. 24, 2012, the entire contents of all of which are incorporated herein by reference.

FIELD

Embodiments described herein relate generally to a circuit board with, for example, a ball grid array (BGA) mounted thereon, an electronic device with the circuit board, and a method of manufacturing the circuit board.

BACKGROUND

A structure in which a reinforcing plate is fixed to the back surface of a circuit board provided with a BGA is known. The reinforcing plate is provided along the outer periphery of the BGA to secure connection of the peripheral portion of the BGA.

However, no consideration is given to connection reliability of the central portion of the BGA, and hence there is a demand for a further improvement.

Thus, development of a circuit board with electronic components having a high connection reliability is demanded.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIGS. 9A, 9B, 9C, 9D, 9E, 9F, 9G and 9H are views useful in explaining a method of manufacturing the circuit board of FIG. 3;

FIGS. 12A, 12B, 12C and 12D are operation views useful in explaining a method of manufacturing the circuit board of FIG. 10;

FIG. 13 is a plan view illustrating a reinforcing plate according to a second embodiment;

FIG. 16 is a plan view illustrating a reinforcing plate according to a fifth embodiment;

FIG. 17 is a schematic view illustrating a circuit board provided with a reinforcing plate according to a sixth embodiment;

FIG. 21 is a schematic view illustrating a heat dissipation sheet provided between the reinforcing plate of FIG. 20 and the casing;

FIG. 22 is a cross sectional view illustrating a modification of the reinforcing plate of FIG. 17; and FIG. 23 is a cross sectional view illustrating another modification of the reinforcing plate of FIG. 17.

DETAILED DESCRIPTION

Various embodiments will be described hereinafter with reference to the accompanying drawings.

In general, according to one embodiment, a circuit board is provided with a first rectangular electronic component, a board and a reinforcing plate. The first electronic component has a plurality of connection terminals. The board has the first electronic component mounted thereon via the connection terminals, and has a through hole for receiving a second electronic component at a position at which the first electronic component overlaps with the second electronic component. The reinforcing plate is attached to the back surface of the board, and has a plurality of first portions near the corner portions of the first electronic component, and a second portion of a strip shape coupling the first portions and located near the hole. The first and second portions are formed integral as one body.

Embodiments will be described in detail with reference to the accompanying drawings.

Figure 1:
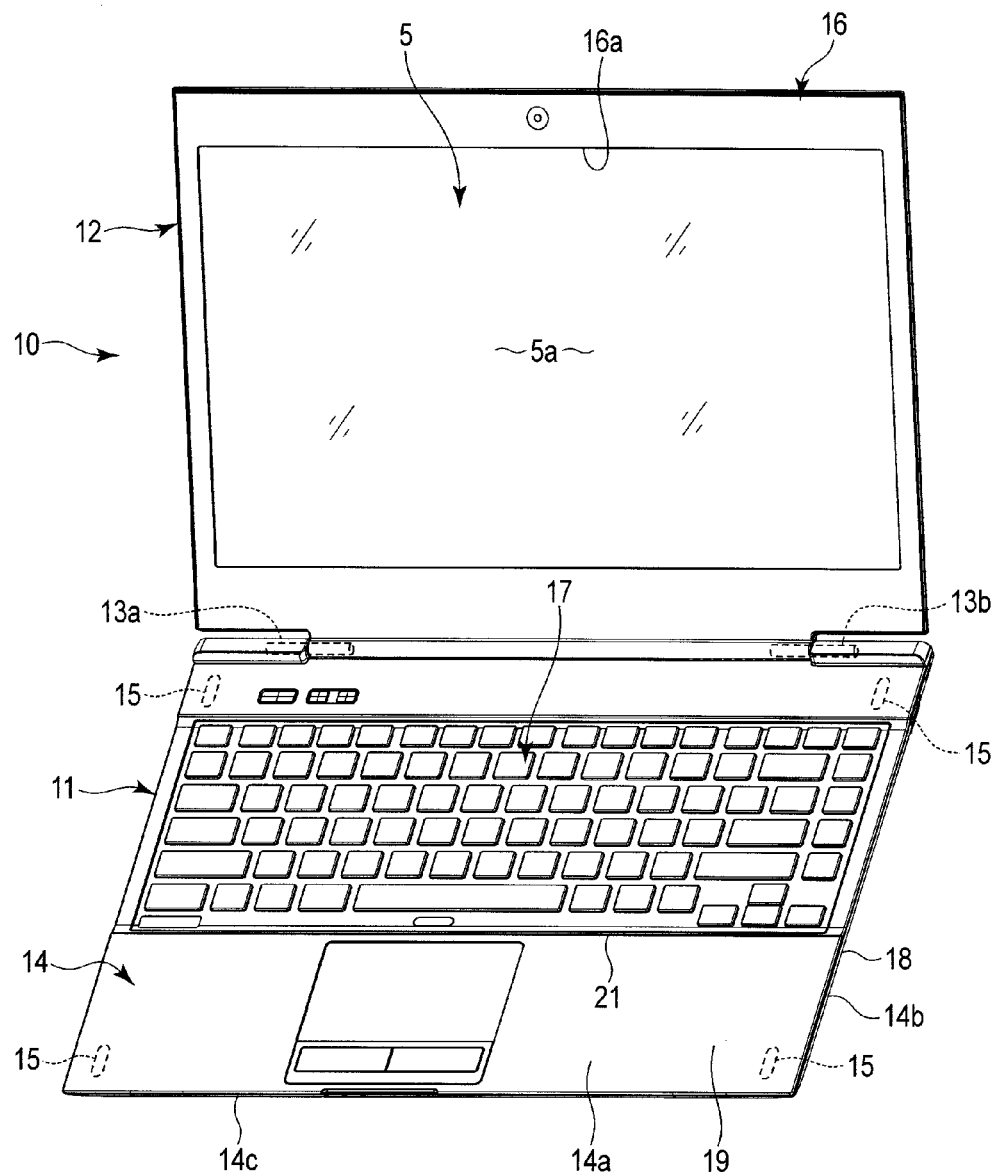
FIG. 1 is a perspective view illustrating an electronic device according to embodiments.

FIG. 1 is a perspective view illustrating an electronic device 10 according to embodiments. The electronic device 10 is, for example, a notebook-type portable computer (note PC). The electronic device, to which the embodiments are applicable, is not limited to the PC, but is broadly applicable to a large number of electronic devices, such as slate-type portable computers (slate PCs or tablets), television receivers, portable telephones (including smart phones), game machines.

As shown in FIG. 1, the electronic device 10 comprises a first unit 11, a second unit 12, and hinges 13a and 13b. The first unit 11 is, for example, a main unit containing a main board. The first unit 11 includes a first casing 14 (casing). The first casing contains, for example, a circuit board 6

(described later) as the main board. The first casing 14 comprises an upper wall 14a, a lower wall 14b and a peripheral wall 14c, and is formed like a flat box.

When the electronic device 10 is placed on, for example, a desk, the lower wall 14b faces the upper surface (mount surface) of the desk. The lower wall 14b has, for example, a plurality of leg portions 15 that are brought into contact with the mount surface of the desk when the electronic device 10 is placed on the desk. The upper wall 14a is opposite to the lower wall 14b. The upper wall 14a extends substantially parallel with the lower wall 14b with a certain space defined therebetween. The peripheral wall 14c couples the periphery of the lower wall 14b to that of the upper wall 14a.

The second unit 12 is, for example, a display unit, and comprises a second casing 16 and a display unit 5 contained in the second casing 16. The display unit 5 is, for example, a liquid crystal display, but is not limited to it. The display unit 5 has a display screen 5a. The second casing 16 has an opening 16a through which the display screen 5a is exposed.

The second casing 16 is rotatably (openabley/closably) coupled to an end of the first casing 14. This enables the first and second casings 14 and 16 to rotate relative to each other between a closed position at which the first and second casings 14 and 16 are superposed on each other, and an open position (as shown in FIG. 1) at which the first and second casings 14 and 16 are open relative to each other.

A keyboard 17 as an input device is provided on the upper wall of the first casing 14 (hereinafter referred to simply as "the casing 14") of the first unit 11. The input unit is not limited to the keyboard 17, but may be a touch panel (touch sensor) or other input devices.

The casing 14 has a base 18 (lower cover) and a cover 19 (upper cover). The base 18 includes the lower wall 14b and a part of the peripheral wall 14c. The cover 19 includes the upper wall 14a and a part of the peripheral wall 14c. In the embodiments, the casing 14 is formed by combining the base 18 and the cover 19.

The cover 19 has a keyboard attachment portion 21 to which the keyboard 17 is attached. The keyboard attachment portion 21 extends along substantially the entire length of the casing 14. The keyboard attachment portion 21 is at a lower level than the upper wall 14a to receive therein the keyboard 17. When the keyboard 17 is received in the keyboard attachment portion 21, it is substantially level with the upper wall 14a or is at a slightly higher level than the upper wall 14a.

Figure 2:
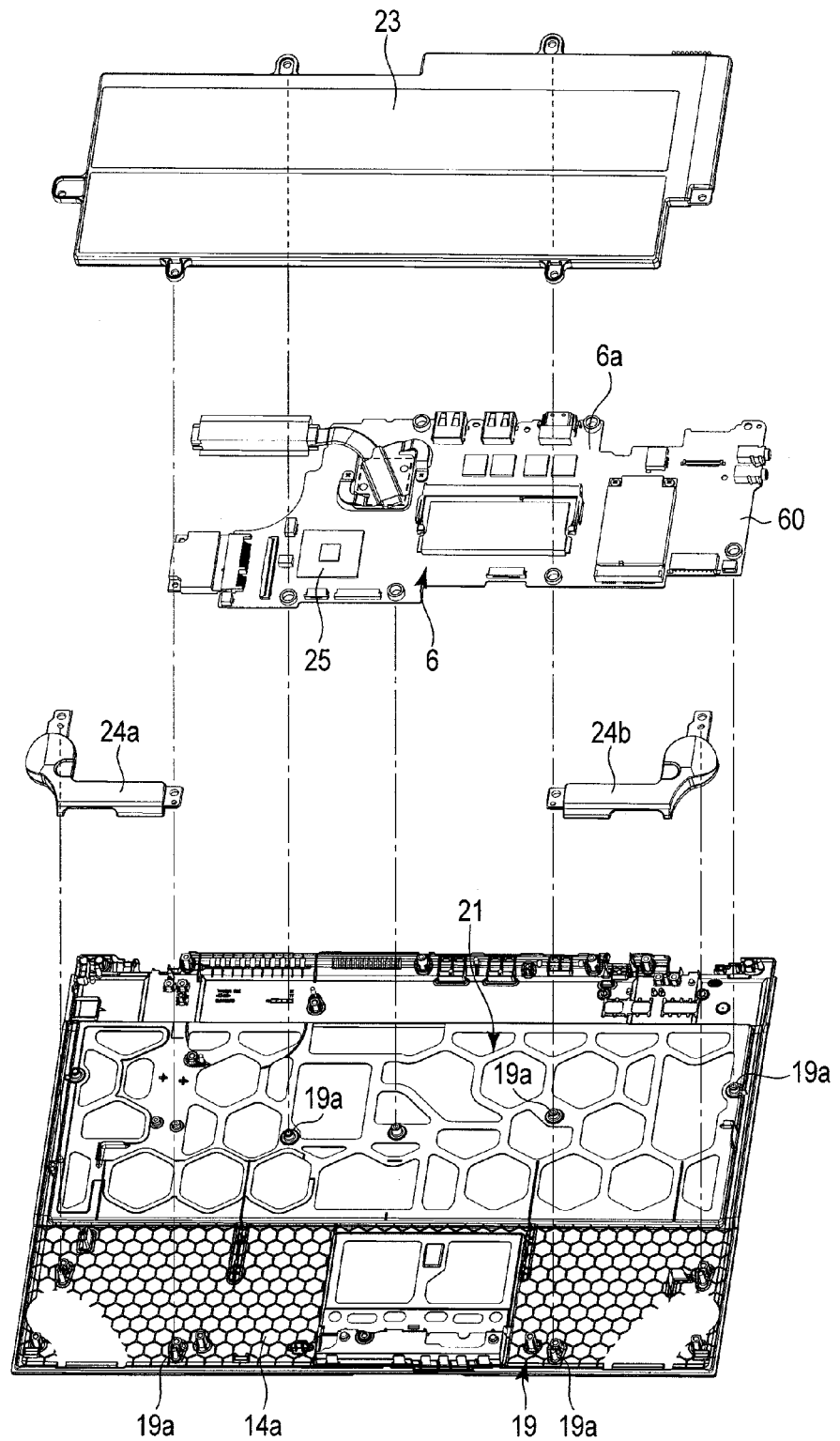
FIG. 2 is an exploded perspective view illustrating the main body of the electronic device of FIG. 1.

FIG. 2 is an exploded perspective view illustrating the first unit 11. FIG. 2 does not show the base 18. A circuit board 6, a battery 23 and loud speakers 24a and 24b are attached to the inner surface of the inversed cover 19. The circuit board 6 is attached to the back (lower) surface of the keyboard attachment portion 21, and is positioned close to the base 18 (not shown in FIG. 2) than to the keyboard attachment portion 21. The circuit board 6 is electrically connected to the display unit 5 via, for example, a cable (not shown). The circuit board 6 of the embodiments is of a one-side mounting type in which a plurality of electronic components are mounted on the surface 6a of a board 60 (i.e., the first surface 6a shown in FIG. 2).

The board 60 has the first surface 6a, and a second surface 6b (back surface) located opposite to the first surface 6a. In the embodiments, the first surface 6a is the lower surface of the board 60 facing the base 18, and the second surface 6b is the upper surface of the board 60 facing the cover 19. Alternatively the first and second surfaces 6a and 6b may be located in an opposite manner.

As shown in FIG. 2, an electronic component 25 is mounted on the first surface 6a of the circuit board 6. The electronic component 25 is, for example, a surface-mount type semiconductor component. When a current flows through the electronic component 25, the electronic component 25 generates heat. In the embodiments, the electronic component 25 is, for example, a ball grid array (BGA). However, the electronic component 25 is not limited to the BGA, but may be any appropriate component, such as area-array type or other type semiconductor components. In addition to the electronic component 25, some other electronic components (not shown) are attached to the first surface 6a of the circuit board 6.

Figure 3:
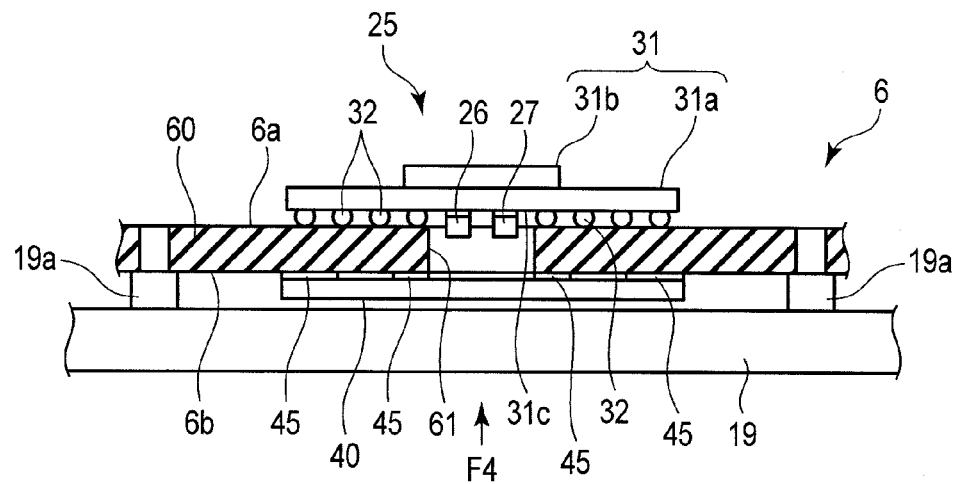
FIG. 3 is a schematic view illustrating an attachment structure incorporated in an electronic component attached to the circuit board shown in FIG. 2.
Figure 4:
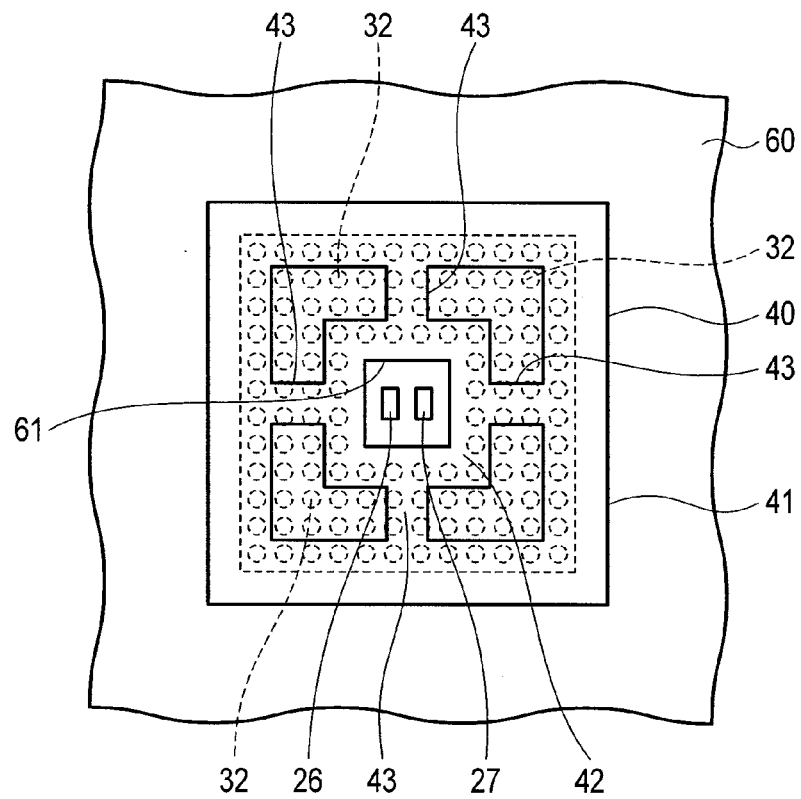
FIG. 4 is a partially exploded plan view illustrating the circuit board as viewed in the direction indicated by arrow F4 in FIG. 3.
Figure 5:
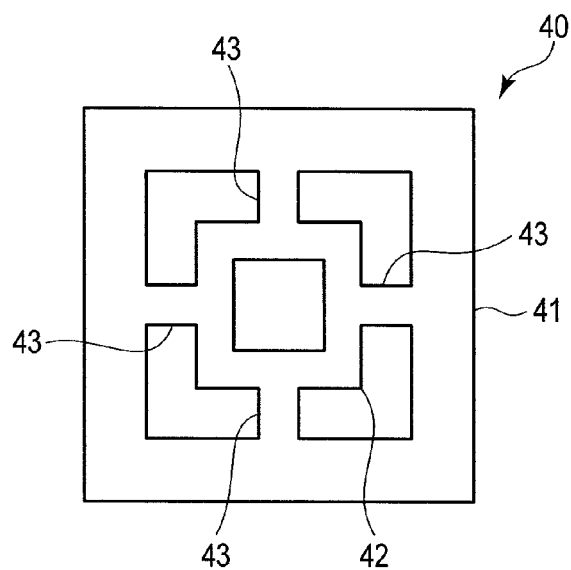
FIG. 5 is a plan view illustrating a reinforcing plate employed in the first embodiment of FIG. 4.

Referring now to FIGS. 3 to 5, an attachment structure for the electronic component 25 will be described.

FIG. 3 is a schematic view illustrating the attachment structure for the electronic component 25. In FIG. 3, to facilitate the description, only the board 60 is shown as a cross section obtained by cutting the board about the center of a hole 61 described later. Further, FIG. 4 is a partially exploded plan view illustrating the circuit board 6 as viewed from the cover 19 side of FIG. 3. Furthermore, FIG. 5 is a plan view illustrating a reinforcing plate 40 (reinforcing member) employed in the first embodiment of FIG. 4.

The reinforcing plate 40 is attached to the second surface 6b of the circuit board 6 at the position at which it overlaps with the electronic component 25 with the board 60 interposed therebetween. The reinforcing plate 40 has substantially the same size as the electronic component 25. In FIG. 4, the electronic component 25 attached to the first surface 6a side of the circuit board 6 is indicated by a broken line. Further, although FIGS. 3 and 4 show only the electronic component 25 attached to the first surface 6a of the circuit board 6, a large number of electronic components (not shown) are mounted on the first surface 6a of the circuit board 6, as well as the electronic component 25.

As shown in FIG. 3, the electronic component 25 comprises a package 31 and a plurality of bumps 32. The package 31 includes a substrate 31a and a semiconductor chip 31b mounted on the substrate 31a. The package 31 is a case for protecting the components from the external environment. The package 31 is not limited to a member that covers the entire component, but a part of the component may be exposed to the outside through the package.

The package 31 is in the shape of, for example, a rectangular flat box, and the substrate 31a has four corners and four sides. Further, the substrate 31a of the package 31 has a rectangular back surface 31c facing the first surface 6a of the circuit board 6.

On the back surface 31c of the package 31, a plurality of bumps 32 are arranged in a matrix. Further, other electronic components 26 and 27 (other components) are attached to substantially the central portion of the back surface 31c. Although in this embodiment, the two electronic components 26 and 27 are exemplified, three or more electronic components may be attached to the back surface 31c. The bumps 32 are arranged in rows and columns over the entire back surface 31c except for the area in which the two electronic components 26 and 27 are attached. By thus attaching the electronic components 26 and 27 to the back surface 31c of the package 31, the wire lengths of the electronic components 26 and 27 can be shortened.

A plurality of pads (not shown) for electrically connecting the plurality of bumps 32 are provided on the back surface 31c of the substrate 31a. In the embodiments, the bumps 32 are solder balls, and their arrangement is shown using broken lines in FIG. 4. The plurality of bumps 32 are examples of connection terminals for connecting the electronic component 25 to the board 60. Similarly, a plurality of pads (not shown) are provided in a matrix on the opposite first surface 6a of the board 60.

The plurality of bumps 32 are soldered to the corresponding pads on the board 60 by reflow process, described later, thereby electrically connecting the substrate 31a of the package 31 to the first surface 6a of the circuit board 6. Thus, the electronic component 25 is mounted on the first surface 6a of the circuit board 6.

The board 60 has a rectangular hole 61 formed through the portion of the board 60 corresponding to the electronic component 25. The hole 61 receives the electronic components 26 and 27 attached to the back surface 31c of the substrate 31 of the package 31. By thus arranging, in the hole 61 of the board 60, other components attached to the back surface 31c of the electronic component 25, the height of the circuit board 6 along the layers of elements can be reduced, thereby increasing the degree of freedom of component layout. In particular, when such a one-surface mounting type board as the circuit board 6 of the embodiments is employed, the entire thickness of the circuit board 6 can be reduced. In other words, to thin the circuit board 6, the circuit board 6 as the one-surface mounting type board is employed, and the hole 61 for receiving the other electronic components 26 and 27 is formed in the board 60.

The hole 61 does not always have to be formed through the board 60, but may be a depression in the first surface 6a. Further, the hole 61 does not always have to be formed about the center of the electronic component 25. It is sufficient if the hole may overlap with the electronic component 25. The position of the hole 61 is determined in accordance with the positions of the two electronic components 26 and 27 attached to the back surface 31c of the package 31.

However, where such a hole as the hole 61 is formed in the circuit board 6, the rigidity of the hole-formed portion of the circuit board 6 is reduced and hence the circuit board is liable to be deformed. Therefore, if an external force is executed, the stress corresponding to the force may well be concentrated on the portion in and around the hole 61. In particular, in the surface-mounting type electronic component 25 using the bumps 32, when such stress occurs, it may well concentrate on the innermost bumps 32 around the hold 61, thereby causing disconnection at those bumps. To avoid this, in the embodiments, the reinforcing plate 40 is provided on the second surface 6b of the board 60 in which the hole 61 is formed. The reinforcing plate 40 is adhered to the second surface 6b of the board 60 by adhesive members 45.

As shown in FIGS. 4 and 5, a reinforcing plate 40 according to a first embodiment comprises a rectangular outer frame portion 41 extending along the four corners and four sides of the substrate 31a of the electronic component 25, a rectangular inner frame portion 42 extending along the hole 61 of the board 60, and four coupling portions 43 coupling the two frame portions. More specifically, the outer frame portion 41 of the reinforcing plate 40 is located at a position at which it overlaps with some bumps 32 that are outermost ones of the bumps provided on the back surface 31c of the package 31, and the inner frame portion 42 of the reinforcing plate 40 is located at a position at which it overlaps with some other bumps 32 that are closest to the hole 61 of the board 60. It is sufficient if at least one coupling portion 43 is provided. Two coupling portions 43 may be provided with the hole 61 interposed therebetween. In any case, it is sufficient if the reinforcing plate 40 has rigidity by integrally coupling all portions thereof.

The four corners of the outer frame portion 41 of the reinforcing plate 40 function as first portions opposing and close to the respective four corners of the electronic component 25, and the other portions of the reinforcing plate 40 function as second portions that extend close to the hole 61 of the board 60 and couple the first portions. The bumps 32 that may easily suffer connection breakage are those closest to the edge (corners and sides) of the substrate 31a of the package 31 or to the edge of the hole 61 of the circuit board 6. In the first embodiment, they are the outer bumps closest to the outer edge of the substrate 31, and the inner bumps closest to the hole 61 of the board 60. In light of this, in the first embodiment, the reinforcing plate 40 has a shape that covers the portions at which connection breakage may easily occur.

In the case of the one-side mount type circuit board 6 of the first embodiment that has no electronic components on the second surface 6b of the board 60, the reinforcing plate 40 can be soldered to the second surface 6b of the board 60. Namely, in this case, since no wiring pattern is formed on the second surface 6b of the board 60, no short-circuiting will occur in the wiring pattern by soldering. Further, in this case, the portions connected by solder can be any portions of the entire surface of the reinforcing plate 40. However, it is preferable that at least the four corners of the outer frame portion 41 of the reinforcing plate 40 and the four corners of the inner frame portion 42 of the same are formed as the portions connected by solder. This can enhance the rigidity of the portions of the board 61 corresponding to the portions of the electronic component 25 that may most easily suffer connection breakage, thereby suppressing deformation due to concentration of stress. Even in the one-surface mount type, the reinforcing plate 40 may be attached to the second surface 6b of the board 60 using adhesive members 45, such as an insulting adhesive or an adhesive sheet.

On the other hand, in a double-side mount type circuit board 6 having opposite surfaces provided with electronic components, the reinforcing plate 40 can be attached to the second surface of the board 60, using the adhesive members 45 such as insulating adhesive members or adhesive sheets. Also in this case, for the same reason as the above, the reinforcing plate 40 can be adhered at any portion of the entire surface thereof, and it is preferable that at least the four corners of the outer frame portion 41 of the reinforcing plate 40 and the four corners of the inner frame portion 42 of the same are formed as the portions connected by solder.

Further, in the both-side mount type circuit board 6, the reinforcing plate 40 can be fixed by using solder as the adhesive members (material) 45. In this case, since a wiring pattern (not shown) is formed on the second surface 6b of the board 60, the adhesive members (material) 45, i.e., solder, cannot be provided at any portion of the entire surface of the reinforcing plate 40. Therefore, in this case, it is necessary to provide the adhesive members 45 on a portion other than the wiring pattern. However, if the adhesive members 45 are provided in accordance with the configuration of the wiring pattern, they will influence the adhesion strength or adhesion position of the reinforcing plate 40. To avoid this, it is desirable to provide the adhesive members 45 at appropriate positions and then form the wiring pattern at a position at which the wiring pattern does not overlap with the adhesive members 45.

Figure 6:
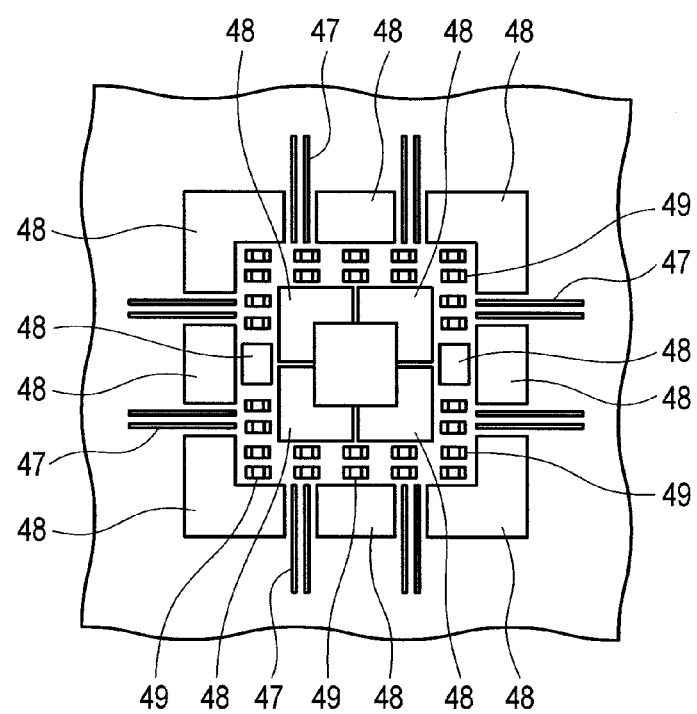
FIG. 6 is a plan view illustrating a pattern layout example of a second surface incorporated in the circuit board of FIG. 3, in which the reinforcing plate is removed.
Figure 7:
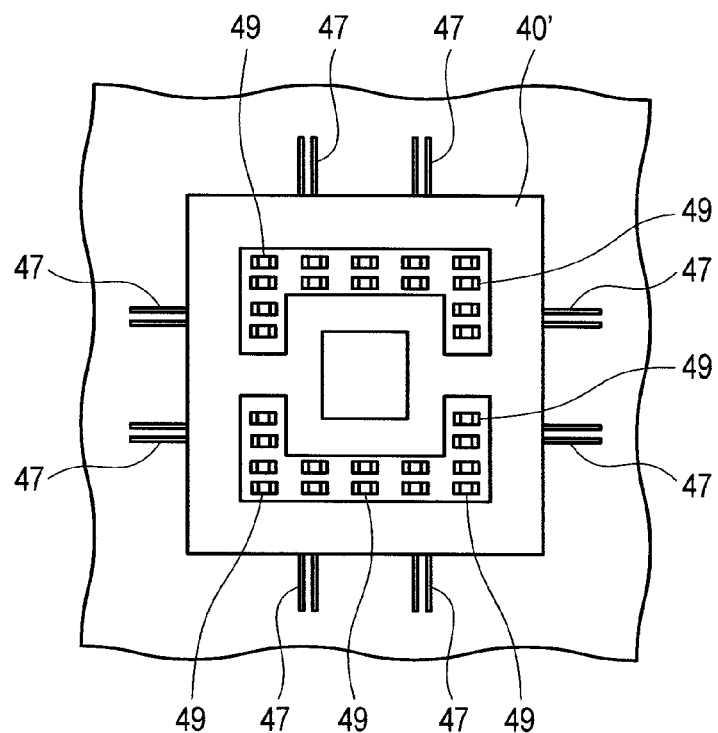
FIG. 7 is a plan view illustrating a state in which the reinforcing plate is attached via the patterned structure.

FIG. 6 shows a layout example of parts 47 of the wiring pattern formed on the second surface 6b of the board 60, a plurality of lands 48 formed on the second surface 6b of the board 60 to provide the adhesive members 45 of solder, and a plurality of electronic components 49 mounted on the second surface 6b. In FIG. 6, showing of the wiring connected to the wiring pattern 47 is omitted. Further, FIG. 7 is a plan view illustrating a state in which a reinforcing plate 40' is fixed to the lands 48 of FIG. 6 via the adhesive members 45 formed of solder. The reinforcing plate 40' shown in FIG. 7 has a structure, in which two coupling portions 43 (i.e., the lower and upper ones) included in the four coupling portions 43 of the reinforcing plate 40 of FIG. 4 are not provided.

If the layout shown in FIG. 6 is employed, the reinforcing plate 40' can be reliably fixed to the second surface 6b of the board 60 to thereby prevent connection breakage of the bumps 32 due to concentration of stress. In particular, using a plurality of small lands 48 as shown in FIG. 6, the adhesion by solder can be enhanced. Namely, if the area of each land 48 is increased, adhesion by solder becomes unstable because melted solder has a relative high surface tension. Therefore, it is preferable to use lands 48 of small areas.

Furthermore, if the shown layout is employed, there is no interference between the wiring pattern 47 on the second surface of the board 60 and the adhesive members 45 of solder, which enhances the reliability of connection. Namely, in the shown layout, since wires of the wiring pattern 47 are led through the gaps between the lands 48, interference can be avoided.

Yet further, if this layout is employed, a space for mounting a plurality of electronic components 49 can be formed between the outer frame portion 41 and the inner frame portion 42 of the reinforcing plate 40'. Thus, a component mounting space can be secured. In particular, if the number of coupling portions 43 is reduced as in the above-mentioned reinforcing plate 40', the space for mounting the electronic components 49 can be further enlarged.

Figure 8:
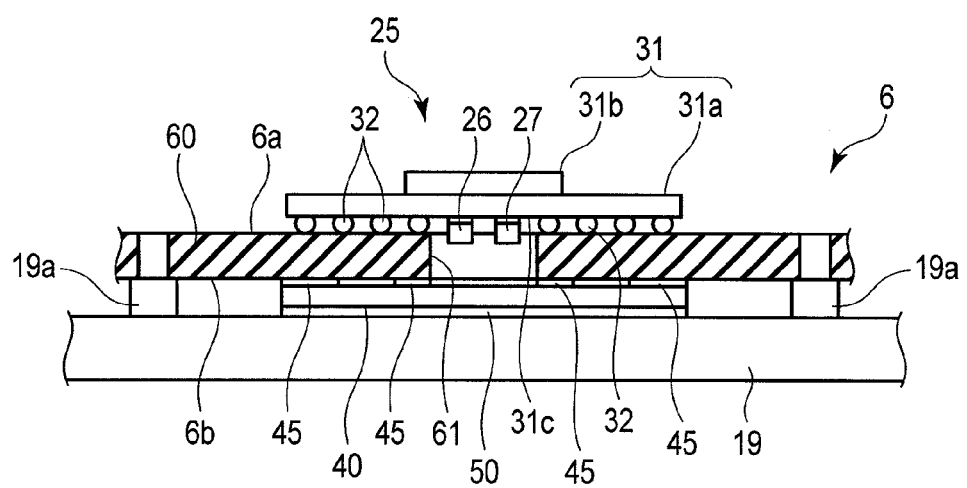
FIG. 8 is a schematic view illustrating a heat dissipation sheet provided between the reinforcing plate of FIG. 3 and a casing.

As described above, the circuit board 6 with the reinforcing plate 40 provided on the second surface 6b is fastened to bosses 19a (see FIG. 3) incorporated in the cover 19 of the casing 14, with the reinforcing plate 40 opposed to the cover 19, using screws (not shown). At this time, if, for example, a heat dissipation sheet 50 (heat dissipation member) is provided between the inner surface of the cover 19 and the reinforcing plate 40 as shown in FIG. 8, the heat dissipation performance of the electronic component 25 is enhanced.

As described above, in the first embodiment, the hole 61 for receiving the components 26 and 27 provided on the back surface 31c of the electronic component 25 is formed in the board 60 to enhance the degree of freedom of the component layout, and deformation of the board 60 near the hole 61 can be prevented. As a result, even the surface-mount type circuit board 6 with the electronic component 25, using the bumps 32 as connection terminals, is free from reduction of reliability of connection. In particular, in the first embodiment, since the inner frame portion 42 of the reinforcing plate 40 is fixed to the second surface 6b of the board 60 near the hole 61 of the board 60, the deformation of the board 60 due to concentration of stress near the hole 61 can be prevented, and the connection reliability can be enhanced even near the center of the electronic component 25.

Referring then to FIG. 9, a method of manufacturing the circuit board 6 with the above-described reinforcing plate 40 will be described. A description will now be given of the case where the reinforcing plate 40 is fixed to the second surface 6b of the above-described one-side mount type board 60 using the adhesive members 45 of solder.

Firstly, the board 60 with the hole 61 formed therein is prepared as shown in (a) of FIG. 9. Subsequently, as shown in (b) of FIG. 9, each adhesive member 45 of solder are printed on the second surface 6b of the board 60. The adhesive members 45 are formed by, for example, patterning an adhesive material (solder) at positions corresponding to the plurality of lands 48 of FIG. 6. After that, as shown in (c) of FIG. 9, the reinforcing plate 40 is placed on the second surface 6b with each adhesive member 45 interposed therebetween, and then each adhesive member 45 is melted by a reflow process to adhere the reinforcing plate 40 to the second surface 6b of the board 60, as shown in (d) of FIG. 9.

Thereafter, the board 60 with the reinforcing plate 40 fixed thereto is reversed as shown in (e) of FIG. 9, and then a plurality of pads 46 of solder are printed on the first surface 6a of the board 60 as shown in (f) of FIG. 9. The pads 46 correspond to the respective bumps 32. Further, as shown in (g) of FIG. 9, the electronic component 25 is placed on the first surface 6a with the pads 46 opposed to the bumps 32, and then, as shown in (h) of FIG. 9, the bumps 32 are melted by a second reflow process to thereby fix the electronic component 25 to the first surface 6a of the board 60.

Thus, the components 26 and 27 attached to the back surface 31c of the electronic component 25 are received in the hole 61 of the board 60, the electronic component 25 is mounted on the first surface 6a of the board 60, and the reinforcing plate 40 is attached to the second surface 6b of the board 60. This is completion of the circuit board 6.

Figure 10:
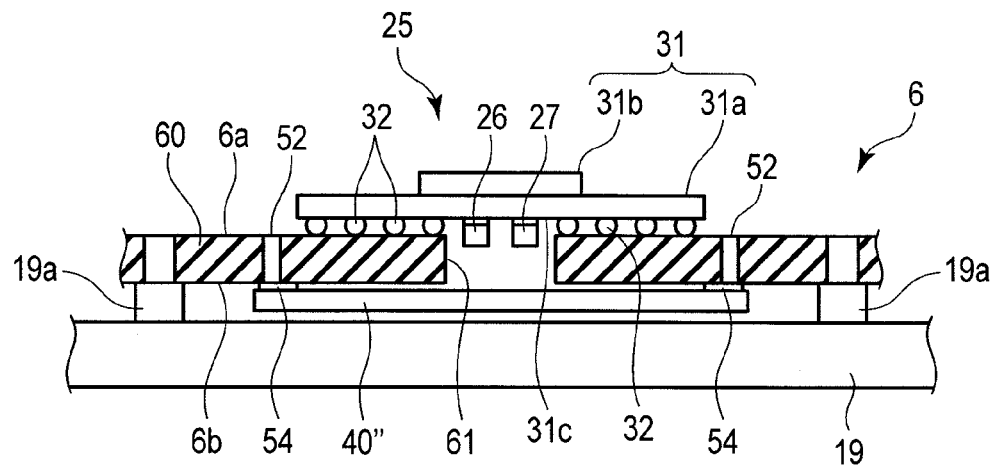
FIG. 10 is a schematic view useful in explaining another attachment example for the reinforcing plate of FIG. 3.
Figure 11:
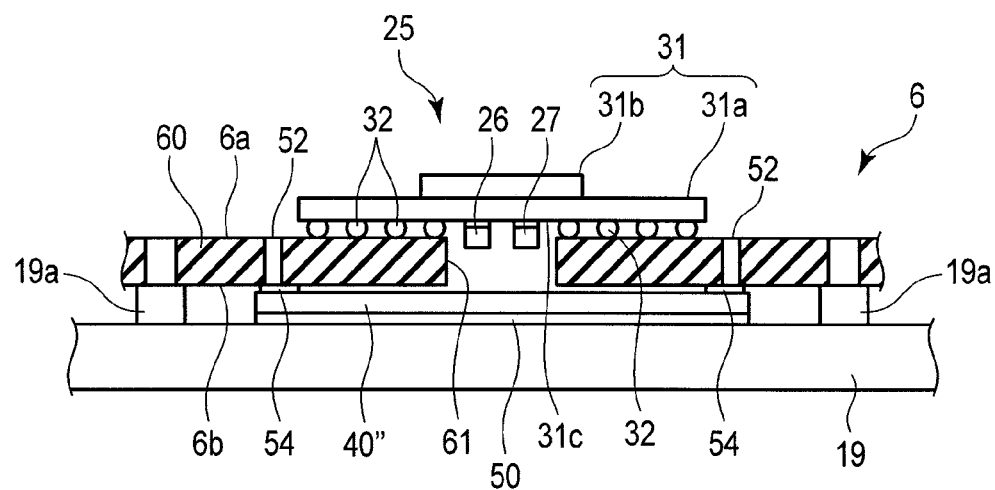
FIG. 11 is a schematic view illustrating a heat dissipation sheet provided between the reinforcing plate of FIG. 10 and the casing.

FIG. 10 is a schematic view useful in explaining another attachment example for the reinforcing plate 40. Since FIG. 10 corresponds to FIG. 3, like reference numbers denote like elements in these figures, and no duplication of description is given thereof. Namely, a reinforcing plate 40'' in FIG. 10 is not fixed to the second surface 6b of the board 60 via the adhesive members 45, unlike the structure of FIG. 3, but is fixed to the second surface 6b by melted solder 54 that is guided from the first surface 6a side to the second surface 6b side via through holes 52. Also in this case, the above-mentioned heat dissipation sheet 50 may be provided between the reinforcing plate 40'' and the cover 19, as shown in FIG. 11.

Referring to FIG. 12, a method of manufacturing the circuit board of FIG. 10 will be described. In FIG. 12, elements corresponding to the above-described ones are denoted by corresponding reference numbers.

Firstly, a board 60' with a hole 61 is prepared, and the reinforcing plate 40'' is aligned with the hole 61 with a slight clearance defined therebetween, as is shown in (a) of FIG. 12. The reinforcing plate 40'' has a size corresponding to that obtained by slightly outwardly extending the outer periphery of the reinforcing plate 40. The reinforcing plate 40'' may hold a holding member 56 shown in (b) of FIG. 12.

The board 60' has a plurality of slim holes 52 extending through the board 60' between the first surface 6a and the second surface 6b, as well as the above-described hole 61. The holes 52 are provided at positions corresponding to the above-mentioned outwardly extended portion of the reinforcing plate 40''. The number of the holes 52 may be set arbitrarily, and it is sufficient if they are provided at positions corresponding to the reinforcing plate 40''. The holes 52 may have such a small diameter as will cause capillary phenomenon for solder.

After that, as shown in (b) of FIG. 12, a plurality of pads 46 formed of solder are printed on the first surface 6a of the board 60', and solder 53 is printed at positions at which it blocks the holes 52. The plurality of pads 46 correspond to the plurality of bumps 32 of the electronic component 25. Further, as shown in (c) of FIG. 12, the electronic component 25 is placed on the first surface 6a with the pads 46 of the first surface 6a opposed to the bumps 32, and as shown in (d) of FIG. 12, the bumps 32 are melted by a reflow process to fix the electronic component 25 to the first surface 6a of the board 60'.

At this time, the solder 53 printed at positions for blocking the holes 52 is also melted. Then, the melted solder flows through the holes 52 to the second surface 6b of the board 60', and is hardened in a slight clearance between the second surface 6b of the board 60' and the reinforcing plate 40". The hardened portions 54 fix the reinforcing plate 40" to the second surface 6b of the board 60'.

As a result, the components 26 and 27 attached to the back surface 31c of the electronic component 25 are received in the hole 61 of the board 60, the electronic component 25 is mounted on the first surface 6a of the board 60', and the reinforcing plate 40" is attached to the second surface 6b of the board 60'. This is completion of the circuit board 6.

In the manufacturing method described referring to FIG. 12, the circuit board 6 can be manufactured by one reflow process, and the number of process steps required for manufacturing can be reduced, thereby reducing operator's working load and reducing the manufacturing cost. In the manufacturing method illustrated in FIG. 12, melted solder 54 is guided through a clearance between the second surface 2b of the board 60' and the reinforcing plate 40". Alternatively, for instance, the edge of the hole 52 of the board 60' close to the reinforcing plate 40" may have a larger diameter, and the melted solder be poured into the large-diameter portion. In this case, the reinforcing plate 40" can be placed in contact with the second surface 2b of the board 60', which facilitates positioning of the reinforcing plate 40".

Referring to FIGS. 13 to 16, reinforcing plates according to other embodiments will be described.

As shown in FIG. 13, a reinforcing plate 70 (reinforcing member) according to a second embodiment has an outer frame portion 71 opposing the outer peripheral portion of a substrate 31a (not shown) incorporated in the electronic component 25 (not shown). The reinforcing plate 70 also has two coupling portions 73 that couple the respective pairs of opposite sides of the outer frame portion 71. The two coupling portions 73 cross each other at a position at which they cross the hole 61 of the board 60 that are not shown. In other words, the crossed portion 75 opposes the hole 61 of the board 60.

In the second embodiment, the outer frame portion 71 of the reinforcing plate 70 opposes the outer bumps 32 closest to the outer periphery of the substrate 31a of the electronic component 25, and the crossed portion 75 at which the two coupling portions 73 cross each other is provided near the inner bumps 32 closest to the edge of the hole 61 of the board 60. As a result, the reinforcing plate 70 of the second embodiment enhances the connection reliability of the BGA.

Figure 14:
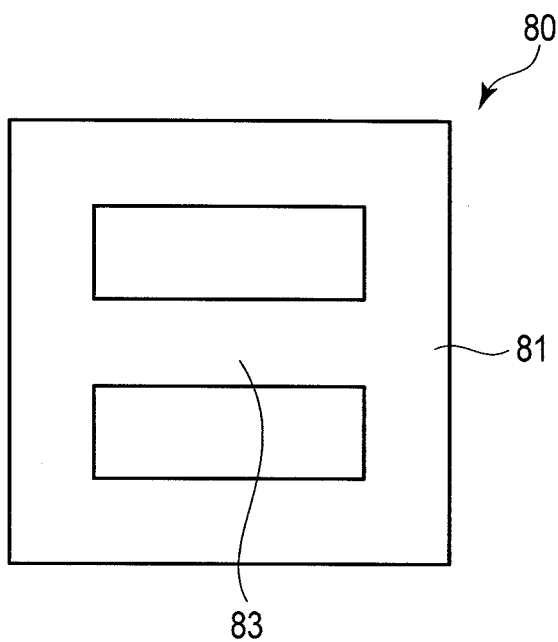
FIG. 14 is a plan view illustrating a reinforcing plate according to a third embodiment.

As shown in FIG. 14, a reinforcing plate 80 (reinforcing member) according to a third embodiment has an outer frame portion 81 opposing the outer peripheral portion of the substrate 31a of the electronic component 25 (which are not shown). The reinforcing plate 80 also has a coupling portion 83 that couples a pair of opposite sides (the right and left sides in the figure) of the outer frame portion 81. The coupling portion 83 crosses the hole 61 of the board 60 (which are not shown).

In the third embodiment, the outer frame portion 81 of the reinforcing plate 80 opposes the outer bumps 32 closest to the outer periphery of the substrate 31a of the electronic component 25, and the coupling portion 83 is provided near the inner bumps 32 closest to the edge of the hole 61 of the board 60. As a result, the reinforcing plate 80 of the third embodiment enhances the connection reliability of the BGA.

Figure 15:
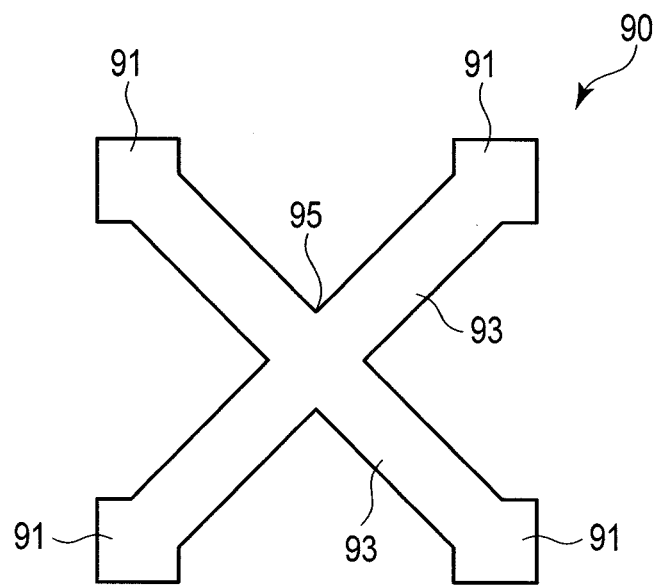
FIG. 15 is a plan view illustrating a reinforcing plate according to a fourth embodiment.

As shown in FIG. 15, a reinforcing plate 90 (reinforcing member) according to a fourth embodiment has four corner portions 91 opposing the four corners of the substrate 31a of the electronic component 25 (which are not shown). The reinforcing plate 90 also has two coupling portions 93 that couple the respective pairs of diagonally located corner portions 91. The two coupling portions 93 cross each other at a position at which they cross the hole 61 of the board 60 (which are not shown). In other words, the crossed portion 95 opposes the hole 61 of the board 60.

In the fourth embodiment, the four corner portions 91 of the reinforcing plate 90 opposes the bumps 32 closest to the four corners of the substrate 31a of the electronic component 25, and the crossed portion 95, at which the two coupling portions 93 cross, is provided near the inner bumps 32 closest to the edge of the hole 61 of the board 60. As a result, the reinforcing plate 90 of the fourth embodiment enhances the connection reliability of the BGA.

As shown in FIG. 16, a reinforcing plate 100 (reinforcing member) according to a fifth embodiment has an outer frame portion 101 opposing the outer peripheral portion of the substrate 31a of the electronic component 25 (which are not shown). The reinforcing plate 100 also has an annular inner portion 102 extending along the edge of the hole 61 of the board 60 (which are not shown). The reinforcing plate 100 further has four coupling portions 103 that couple the four sides of the outer frame portion 101 to the inner portion 102. The inner portion 102 is also applicable to the case where the hole 61 of the board 60 has a different shape, e.g., where the hole 61 is rectangular.

In the fifth embodiment, the outer frame portion 101 of the reinforcing plate 100 opposes the outer bumps 32 closest to the outer periphery of the substrate 31a of the electronic component 25, and inner frame portion 102 opposes or are located near the inner bumps 32 closest to the edge of the hole 61 of the board 60. As a result, the reinforcing plate 100 of the fifth embodiment enhances the connection reliability of the BGA.

Figure 18:
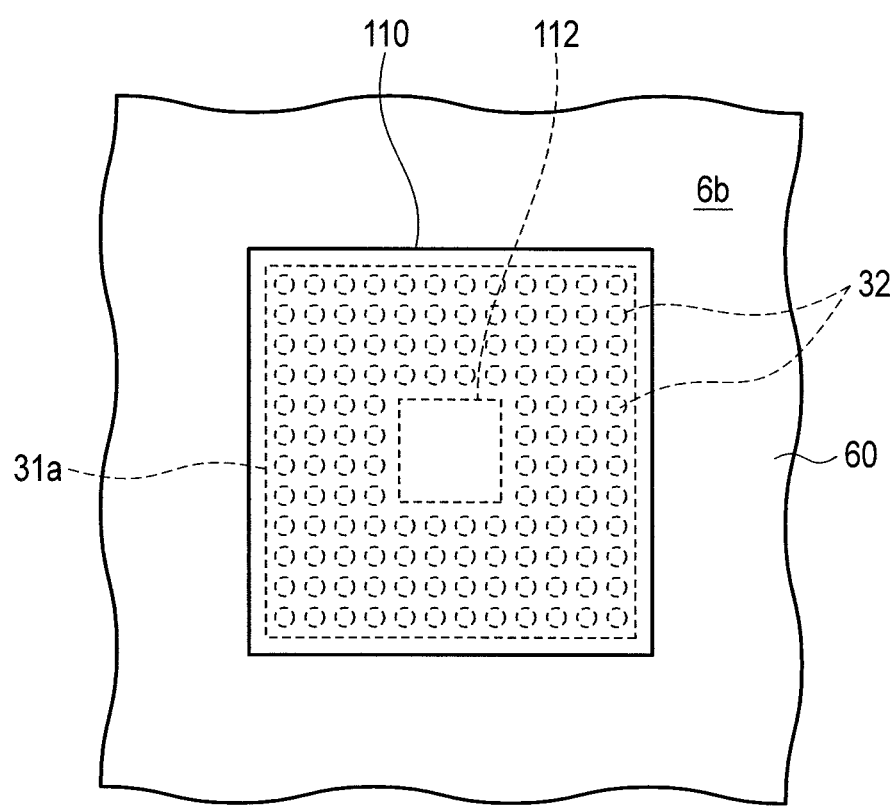
FIG. 18 is a partially enlarged plan view obtained by viewing the circuit board of FIG. 17 in the direction indicated by arrow 18F.
Figure 19A:
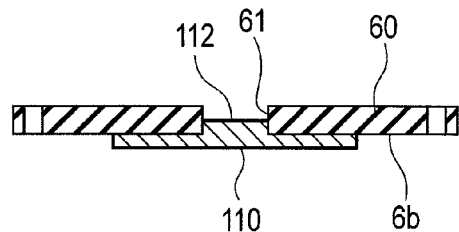
FIGS. 19A, 19B, 19C and 19D are operation views useful in explaining a method of manufacturing the circuit board of FIG. 17.
Figure 19B:
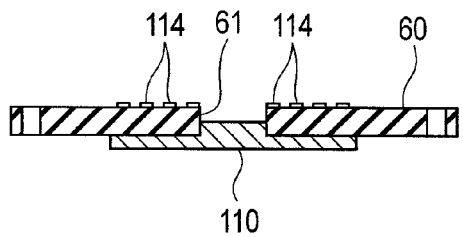
Figure 19C:
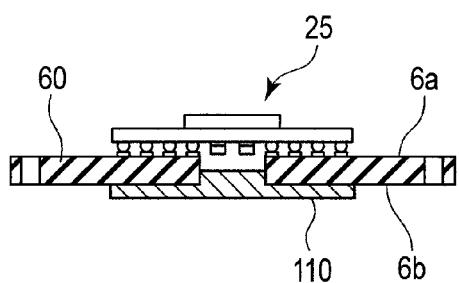
Figure 19D:
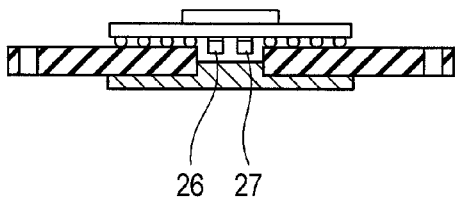

Referring to FIGS. 17 and 18, a reinforcing plate 110 (reinforcing member) according to a sixth embodiment will be described. FIG. 17 is a schematic view illustrating a circuit board 6 provided with the reinforcing plate 110 according to the sixth embodiment. FIG. 18 is a partially enlarged plan view obtained by viewing the circuit board 6 of FIG. 17 in the direction indicated by arrow 18F. In FIG. 18, the electronic component 25 is indicated by the broken line.

The reinforcing plate 110 of the fifth embodiment is formed of, for example, a copper inlay metal, and has a projection 112 formed integral as one body, the projection 112 being to be pressure fitted into the hole 61 of the board 60 from the second surface 6b side of the board 60. The projection 112 has the same shape as the hole 61. In the embodiment, the projection 112 is formed square. Further, the height of the projection 112 is set so as not to interfere with the electronic components 26 and 27 on the back surface 31c of the substrate 31a of the electronic component 25 mounted on the first surface 6a of the board 60. Since the projection 112 of the reinforcing plate 110 is pressure fitted in the hole 61, the reinforcing plate 110 does not need any adhesive member. However, the reinforcing plate 110 may be adhered to the second surface 6b of the board 60 using an adhesive member.

Referring then to FIG. 19, a method of manufacturing the circuit board 6 with the above-described reinforcing plate 110 will be described. Firstly, as shown in (a) of FIG. 19, the board 60 with the hole 61 is prepared, and the projection 112 of the reinforcing plate 110 is pressured fitted into the hole 61 from the second surface 6b side of the board 60. As a result, the reinforcing plate 110 is fixed to the second surface 6b of the board 60. Subsequently, as shown in (b) of FIG. 19, a plurality of pads 114 made of solder are printed on the first surface 6a of the board 60. The plurality of pads 114 correspond to the bumps 32 of the respective electronic component 25. After that, as shown in (c) of FIG. 19, the electronic component 25 is mounted on the first surface 6a with the pads 114 opposed to the bumps, and then, as shown in (d) of FIG. 19, the electronic component 25 is fixed to the firsts surface 6a of the board 60 by melting the bumps 32 using reflow process.

As a result, the electronic components 26 and 27 attached to the back surface 31c of the electronic component 25 are received in the hole 61 of the board 60, whereby the electronic component 25 is mounted on the first surface 6a of the board 60, and the reinforcing plate 110 is attached to the second surface 6b of the board 60, which is the completion of the circuit board 6.

As described above, in the fifth embodiment, since the projection 112 of the reinforcing plate 110 is pressured fitted in the hole 61 of the board 2, the rigidity of the board 60 near the hole 61 can be enhanced to thereby enhance the connection reliability of the BGA. Further, since in the fifth embodiment, an inlay metal is provided in the hole 61 of the board 60, the heat dissipation property of the board 60 can be enhanced.

Figure 20:
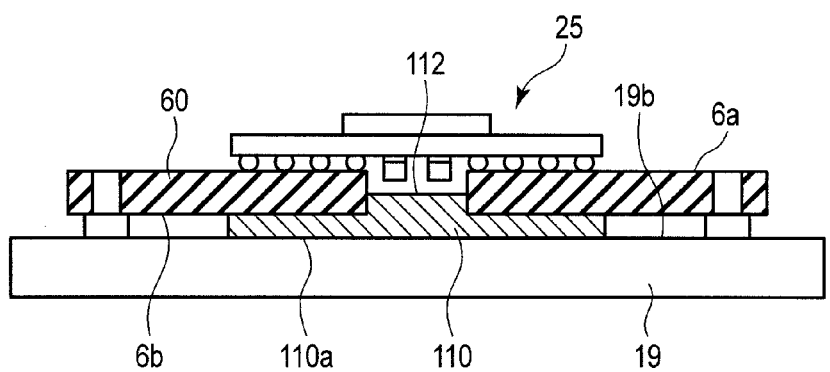
FIG. 20 is a schematic view illustrating a state in which the reinforcing plate of FIG. 17 is in contact with the casing.

For instance, as shown in FIG. 20, the back surface 110a of the reinforcing plate 110 may be kept in contact with the inner surface 19b of the cover 19. In this case, the heat of the board 60 is transferred to the cover 19 via the reinforcing plate 110 of high heat capacity, thereby efficiently dissipating the heat of the electronic component 25. Alternatively as shown in FIG. 21, an insulating heat dissipation member 114 may be interposed between the back surface 110a of the reinforcing plate 110 and the inner surface 19b of the cover 19. The heat dissipation member 114 is, for example, a heat dissipation sheet or heat dissipation grease.

As described above, although the reinforcing plate 110 exhibits excellent heat dissipation performance, it may be thermally deformed because it is also heated in the reflow process in the manufacturing process of the circuit board 6. In light of this, it is advisable to use, as the material of the reinforcing plate 110, a metal having substantially the same thermal expansion coefficient as the board 60. It is also advisable to impart a rib structure to the projection of the reinforcing plate to be pressured fitted into the hole 61 of the board 60, like the projection 116 of a reinforcing plate 110' shown in FIG. 22. Yet alternatively, the projection may have a cylindrical structure like the projection 118 of a reinforcing plate 110" shown in FIG. 23. Even when these reinforcing plates 110' and 110" are thermally expanded, the stress occurring in the hole 61 of the board 60 can be reduced to thereby prevent deformation of the board 60.

Further, when the projection 116 of a rib structure is employed as shown in FIG. 22, the reinforcing plate 110' having a high thermal capacity can be reduced in volume, thereby reducing the amount of heat absorbed by the reinforcing plate 110' during the reflow process to accelerate the melting of the bumps 32. In particular, when the cylindrical projection 118 is employed to form a hole 118a through the reinforcing plate 110", heated air during the reflow process can be guided to the back side of the electronic component 25, which further enhances melting of the bumps 32.

Since in the circuit board according to at least one of the above-described embodiments, at least a part of each of the reinforcing plates 40, 70, 80, 90, 100 and 110 is provided near the hole 61 of the board 60 that receives the electronic components 26 and 27 attached to the back surface 31c of the electronic component 25, the reliability of connection of the electronic components to the board can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a casing; and
   a circuit board on the casing,
   the circuit board comprising:
   a first electronic component comprising a plurality of connection terminals;
   a board comprising a hole over the first electronic component for receiving a second electronic component, the first electronic component on the board via the connection terminals; and
   a reinforcing plate on a back surface of the board, and comprising a plurality of first portions near corner portions of the first electronic component and a second portion connecting the first portions, the second portion near the hole;
   wherein the circuit board is connected to the casing with a heat dissipation member between the reinforcing plate and the casing.

2. The electronic device of claim 1, wherein the second portion of the reinforcing plate crosses the hole.

3. The electronic device of claim 1, wherein the second portion of the reinforcing plate extends annularly along an edge of the hole.

* * * * *